(12) United States Patent
Matsuura

(10) Patent No.: US 11,092,630 B2
(45) Date of Patent: Aug. 17, 2021

(54) SIGNAL PROCESSING METHOD AND MATERIAL TESTING MACHINE

(71) Applicant: SHIMADZU CORPORATION, Kyoto (JP)

(72) Inventor: Tohru Matsuura, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 325 days.

(21) Appl. No.: 16/172,892

(22) Filed: Oct. 29, 2018

(65) Prior Publication Data

US 2019/0187195 A1 Jun. 20, 2019

(30) Foreign Application Priority Data

Dec. 20, 2017 (JP) .............................. JP2017-243754

(51) Int. Cl.
| | |
|---|---|
| G06F 11/30 | (2006.01) |
| G01R 23/167 | (2006.01) |
| G01R 23/177 | (2006.01) |
| G01R 23/175 | (2006.01) |
| G01N 3/32 | (2006.01) |
| G01N 3/30 | (2006.01) |

(52) U.S. Cl.
CPC ............. G01R 23/167 (2013.01); G01N 3/30 (2013.01); G01N 3/32 (2013.01); G01R 23/175 (2013.01); G01R 23/177 (2013.01); G01N 2203/0218 (2013.01)

(58) Field of Classification Search
CPC ...................................................... G01R 23/167
See application file for complete search history.

(56) References Cited

U.S. PATENT DOCUMENTS

| | | | | |
|---|---|---|---|---|
| 5,156,053 A | * | 10/1992 | Shiraishi | G01N 3/08 73/849 |
| 2012/0259487 A1 | * | 10/2012 | Friesen | B61F 5/245 701/20 |

FOREIGN PATENT DOCUMENTS

| | | | | |
|---|---|---|---|---|
| EP | 1065492 A2 | * | 1/2001 | ............... G01N 3/30 |
| JP | 2009058522 | | 3/2009 | |

* cited by examiner

*Primary Examiner* — Phuong Huynh
(74) *Attorney, Agent, or Firm* — JCIPRNET

(57) ABSTRACT

A signal processing method and a material testing machine are provided. A reference function processing part includes a data interval generation part for cutting out input signal from a load cell into time-domain data interval by cutting out the input signal of a predetermined time length, a reference function determining part for determining a reference function to be used in a transform process, and a transform part for transforming the interval data using the reference function. Considering the approximately straight lines near the two ends of the data interval, the reference function is a third degree polynomial function with tangents overlapping with the approximately straight line at both ends of the data interval.

20 Claims, 8 Drawing Sheets

SIGNAL PROCESSING METHOD AND MATERIAL TESTING MACHINE

CROSS-REFERENCE TO RELATED APPLICATION

This application claims the priority benefit of Japan Patent Application No. 2017-243754, filed on Dec. 20, 2017. The entirety of the above-mentioned patent application is hereby incorporated by reference herein and made a part of this specification.

BACKGROUND

Technical Field

The disclosure relates to a signal processing method and a material testing machine.

Description of Related Art

A Fourier transform is performed when spectral analysis is performed in order to quantitatively obtain the intensity (power) and phase of a physical signal at each frequency. An analog signal is a continuous time signal. In contrast thereto, a digital signal is a discrete time signal which is a sequence of sampled values collected in a sampling cycle. For this reason, discrete Fourier transform is used for digital signal processing.

The discrete Fourier transform is obtained by rewriting an infinite interval integral of a normal Fourier transform to the sum of finite interval integrals. Therefore, when performing the discrete Fourier transform, a signal is cut into N times and integrated. On the other hand, even if the cut out interval of the data is chosen under the assumption that the signal is periodic (time data cut out by finite interval), the interval rarely coincides accurately with the integral multiple of the period of the original waveform. Furthermore, since the signal contains many frequency components, it is difficult to select the cut out interval properly, resulting in the state that even if the interval is periodically extended, the signal is not connected properly. If the periodically extended signal becomes discontinuous, noise is mixed in due to the transform. Therefore, a conventional method for avoiding such a state is to cut out the signal using a window function. The window function is a function that is zero-valued outside of the interval, like a Hann window for example, which is a mountain-shaped function with both ends smoothly decreasing and connected to zero.

FIG. 7A and FIG. 7B are schematic diagrams illustrating signal processing to which the conventional window function is applied. FIG. 8 is a graph showing signal processing to which the conventional window function is applied. FIG. 7A is an iterative image of a finite interval of N sampling points, and FIG. 7B is an image after applying the window function indicated by the one-dot dashed line to the waveform in FIG. 7A. In addition, in the graph of FIG. 8, the vertical axis represents amplitude and the horizontal axis represents time.

In signal processing using the conventional window function, raw data are cut into time data of N sampling points as shown in FIG. 7A. Then, when the window function is applied to the cut out interval, as shown by the solid line in FIG. 7B, the data decrease near both ends of the data, and depending on the type of window function, the data at both ends may become zero. For example, as shown in FIG. 8, when data are cut out by the Hann window (indicated by the one-dot dashed line), which has a weight in the center with data at both ends being zero, the raw data indicated by the broken line become data with both ends being zero, as indicated by the solid line, after applying the window function. Thereby, as shown in FIG. 7B, the signal after application of the window function has a continuous waveform in which the interval from −N to zero, the interval from zero to N, and each interval from N to 2N are joined by zeros.

In addition, for the drive signal generating device applied to the fatigue testing machine described in Patent Document 1 (Japanese Laid-Open No. 2009-58522), it has been proposed to adopt the following as a method for splicing divided signals so that the signals do not become discontinuous: that is, the data are spliced by setting overlapping time, and when the divided data are spliced after processing of the Fourier transform and inverse transform, the data are spliced within the overlapping time of the preceding and succeeding divided data at a time when the values of the two signals match or are closest to each other.

When the window function is applied, data decrease near both ends of the time data of the cut out interval. As shown in FIG. 8, although the difference between the values of the raw data as indicated by the broken line and the data multiplied by the window function as indicated by the solid line near the starting position of the interval is not large, there is a large difference in values near the end of the interval. By multiplying by the window function, the values of the original data are lost and the feature of the waveform is impaired. For this reason, it is conceivable to divide by the window function in order to restore the values that decrease due to multiplication of the window function after the data processing. However, when such a process is executed, closer to both ends of the interval, the values become enlarged at high magnification and noise is also amplified. For this reason, it is not realistic to perform the process of dividing the data, which has been multiplied by the window function, by the window function.

Since the method of splicing signals proposed in Patent Document 1 does not use a window function, data will not decrease near both ends of the interval. However, when data is processed repeatedly, although the data being divided are not missing, data at both ends of the overall data converge to the reference zero position and are missing. For example, in the test force data of the time until the test piece of a high speed tensile test breaks, the data at the time of breakage are lost due to signal processing.

SUMMARY

A first embodiment of the disclosure is characterized in including an interval data generating process of dividing an input signal into time-domain interval data by cutting out the input signal by a predetermined time length; a reference function determining process of determining a function as a reference function, wherein the function matches a gradient of a tangent with a tangent point falling on a starting point of the interval data with a gradient of an approximately straight line near a starting position of the interval data and matches a gradient of a tangent with a tangent point falling on an end point of the interval data with a gradient of an approximately straight line near an end position of the interval data; and a transform process of transforming the interval data into adjustment data adjusted using the reference function determined in the reference function determining process so that both ends of a waveform of the interval data smoothly converge to zero.

DESCRIPTION OF THE EMBODIMENTS

Figure 1:
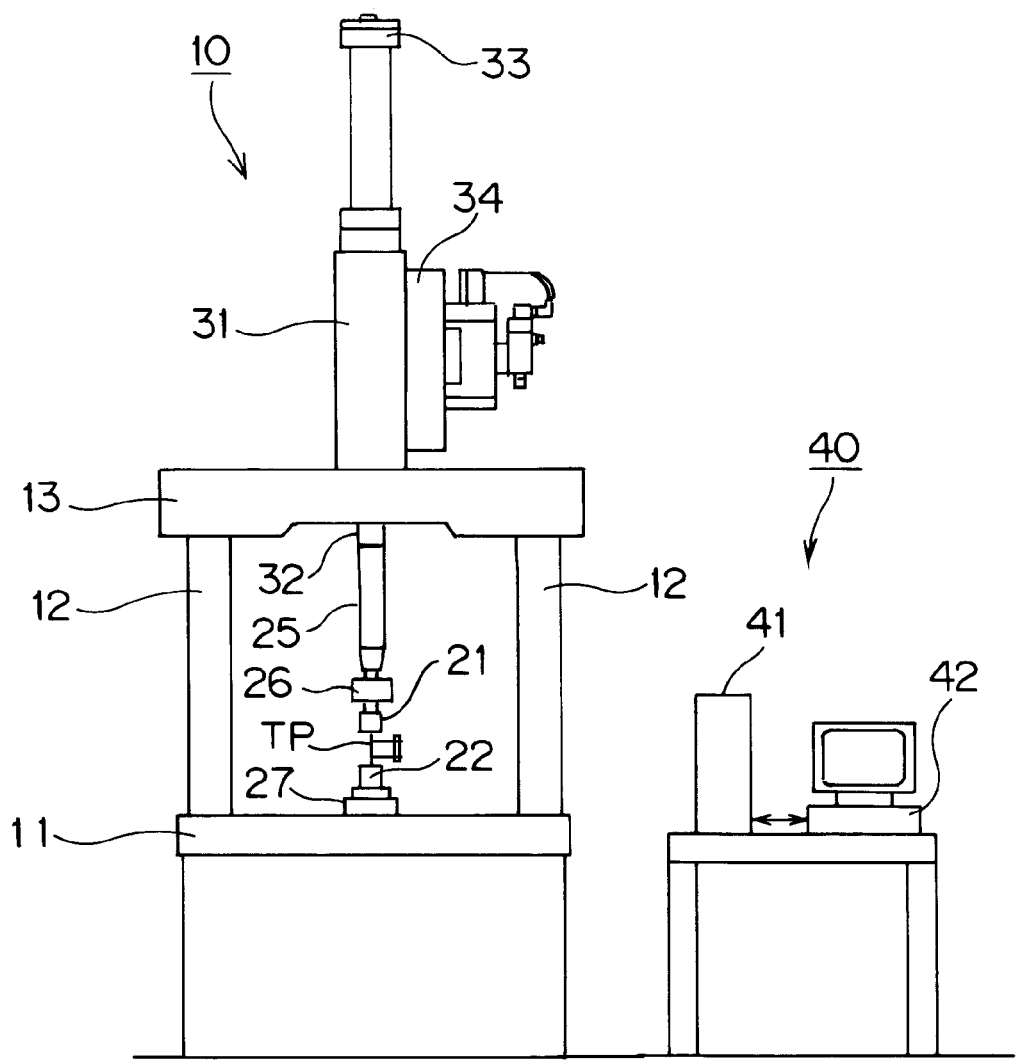
FIG. 1 is a schematic diagram of a material testing machine according to the disclosure.

In view of the above, the disclosure provides a signal processing method and a material testing machine that do not cause missing of data during the process of cutting out and processing a time-domain signal by a finite interval.

According to a second embodiment of the disclosure, in the above-described signal processing method, the reference function is a polynomial function of degree 3 or higher.

According to a third embodiment of the disclosure, in the above-described signal processing method, the reference function determining process sets the starting position of the interval data on a time axis to $t_1$ with a value $y_1$, sets the gradient of the approximately straight line near the starting position which is a tangent at a starting point $(t_1, y_1)$ to $k_1$, sets the end position of the interval data on the time axis to $t_{end}$ with a value $y_{end}$, sets the gradient of the approximately straight line near the end position which is a tangent at an end point $(t_{end}, y_{end})$ to $k_{end}$, and determines a cubic curve $y(x)$ of formula (1) below having coefficients a, b, c, and d expressed by formula (2) below as the reference function.

$$y(x) = a(x - t_1)^3 + b(x - t_1)^2 + c(x - t_1) + d \quad (1)$$

$$\left. \begin{array}{l} a = \dfrac{-2y_{end} + 2y_1 + (k_{end} + k_1)t_{end} + (-k_{end} - k_1)t_1}{t_{end}^3 - 3t_1 t_{end}^2 + 3t_1^2 t_{end} - t_1^3} \\ b = \dfrac{-3y_{end} + 3y_1 + (k_{end} + 2k_1)t_{end} + (-k_{end} - 2k_1)t_1}{t_{end}^2 - 2t_1 t_{end} + t_1^2} \\ c = k_1 \\ d = y_1 \end{array} \right\} \quad (2)$$

According to a fourth embodiment of the disclosure, in the above-described signal processing method, the transform process transforms the interval data into the adjustment data by subtracting the reference function from the interval data.

According to a fifth embodiment of the disclosure, the above-described signal processing method includes a noise removing process of removing noise from the adjustment data, wherein the noise removing process includes: a filtering process performed by a low pass filter; an inverse transform process of performing inverse transform on data, from which high frequency noise has been removed in the filtering process, using the reference function; and a connecting process of connecting the data performed inverse transform in the inverse transform process and restoring the data to chronological data same as the original input signal.

According to a sixth embodiment of the disclosure, a material testing machine includes a control device for processing a time-domain signal input from a physical quantity detector by the above-described signal processing method.

According to a seventh embodiment of the disclosure, in the above-described material testing machine, the physical quantity detector is a force detector that detects a test force given to a test piece in a material test or a displacement meter that detects displacement occurred to the test piece in the material test.

According to the first to the seventh embodiment of the disclosure, the reference function is determined, and the time-domain interval data obtained by cutting out the input signal by a predetermined time length is converted into the adjustment data adjusted using the reference function so that both ends of the waveform of the interval data converge smoothly to zero. Thus, it is possible to smoothly connect each interval data divided from the input signal at the starting point and end point of the interval data respectively. Therefore, by using this reference function instead of the window function in discrete Fourier transform, discrete cosine transform, and discrete wavelet transform, which are used when transforming input signals from the expression of time domain to the expression of frequency domain, it is possible to improve the accuracy of processing for examining frequency characteristics.

According to the fourth embodiment of the disclosure, since the adjustment data can be obtained by subtracting the reference function from the interval data, calculation load can be reduced and fast processing can be realized.

According to the fifth embodiment of the disclosure, after the filtering process performed by the low pass filter on the adjustment data transformed using the reference function, it is possible to reversibly remove the influence of the reference function from the processed data by performing inverse transform using the reference function.

Figure 2:
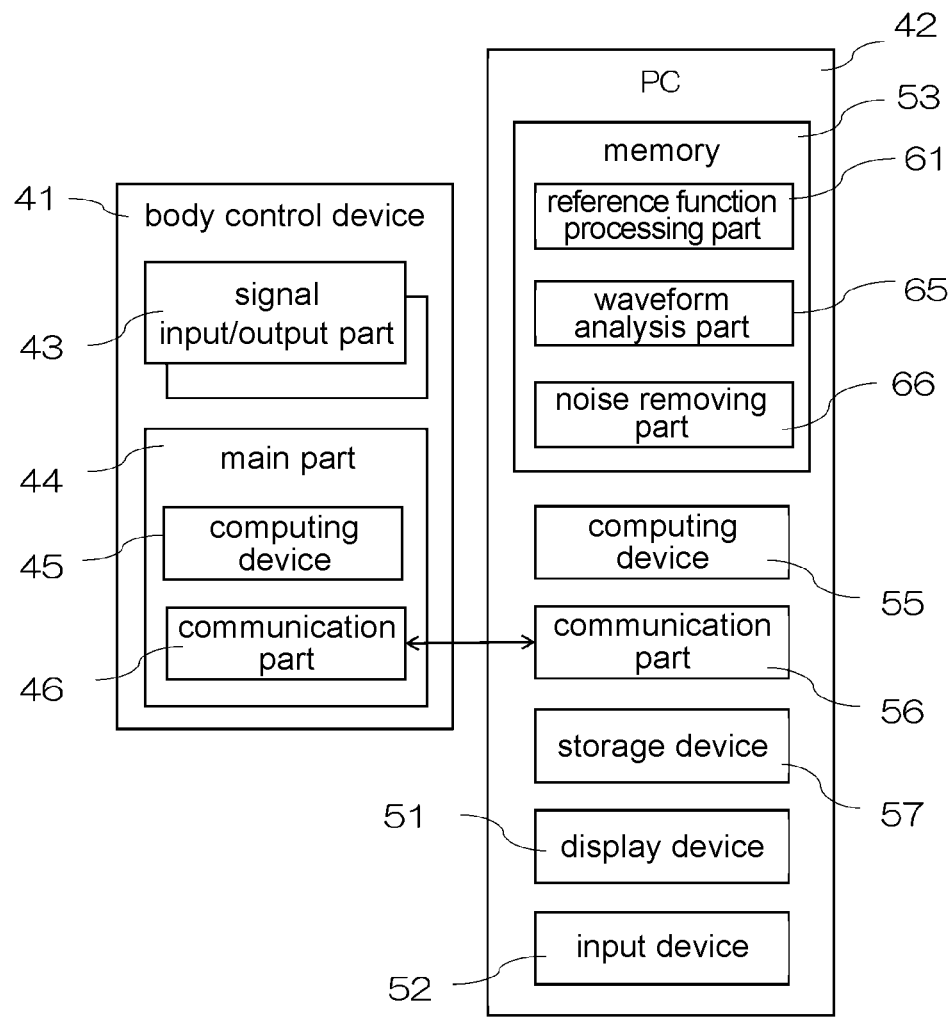
FIG. 2 is a block diagram showing a main control system of a material testing machine according to the disclosure.

Hereinafter, embodiments of the disclosure will be described with reference to the drawings. FIG. 1 is a schematic diagram of a material testing machine according to the disclosure. FIG. 2 is a block diagram showing a main control system of the material testing machine according to the disclosure.

The material testing machine is to test a test piece TP (test target) and to carry out an impact test which imposes a shock load rapidly on the test piece TP by driving a loading mechanism. The material testing machine is also called a high speed tensile testing machine. The material testing machine has a testing machine body 10 and a control device 40. The testing machine body 10 includes a table 11, a pair of supports 12 erected on the table 11, a cross yoke 13 bridged over the pair of supports 12, and a hydraulic cylinder 31 fixed to the cross yoke 13.

The hydraulic cylinder 31 is operated by hydraulic oil supplied from an oil pressure source (not shown) disposed in the table via a servo valve 34. An upper gripper 21 is connected to a piston rod 32 of the hydraulic cylinder 31 via an approach jig 25 and a joint 26. On the other hand, a lower gripper 22 is connected to the table 11 via a load cell 27 which is a force detector. The configuration of the testing machine body 10 is made such that by providing an approach section in the direction of extension of the approach jig 25 and pulling up the piston rod 32 at a high speed of 0.1 to 20 m/s, a high speed tensile test, which rapidly separates the pair of grippers holding the two end parts of the test piece TP, is executed. The displacement (stroke) of the loading mechanism at the time when the high speed tensile test is executed, that is, the movement amount of the piston rod 32, is detected by a stroke sensor 33, and the test force at that time is detected by the load cell 27. The stretch (displacement) of the test piece TP may be obtained from the value detected by the stroke sensor 33 or measured by another displacement meter (not shown).

The control device 40 is composed of a body control device 41 for controlling the operation of the testing machine body 10 and a personal computer 42. The control device 40 processes a time-domain signal input from a physical quantity detector, such as the load cell 27 or the stroke sensor 33. The body control device 41 includes a signal input/output part 43 composed of an amplifier for amplifying an input signal corresponding to a sensor, an A/D converter for converting an analog signal into a digital signal, and a logic circuit for processing a digital signal; and a main part 44 composed of a logic circuit for realizing a test control function, a computing device 45 such as an MPU (micro processing unit) for executing various operations, and a communication part 46 for communicating with the personal computer 42. When executing the high speed tensile test, a control signal is supplied from the main part 44 to the servo valve 34, and the hydraulic cylinder 31 is operated. The output signal of the stroke sensor 33 and the output signal of the load cell 27 are taken into the body control device 41 by the corresponding signal input/output part 43 and digitized.

The personal computer 42 includes a memory 53 composed of a ROM (Read Only Memory) for storing a data analysis program, a RAM (Random Access Memory) for storing temporary data by loading a program at the time of program execution, etc.; a computing device 55 such as a CPU (central processing unit) for executing various operations; a communication part 56 for communicating with externally connected devices such as the body control device 41; a storage device 57 for storing data; a display device 51 for displaying test results; and an input device 52 for inputting test conditions. In the memory 53, a program for realizing the function by operating the computing device 55 is stored. The storage device 57 is a storage part for storing chronological data, which are raw data of test force inputted from the load cell 27, and is made up of a large capacity storage device such as an HDD (hard disk drive). The memory 53, the computing device 55, the communication part 56, the storage device 57, the display device 51, and the input device 52 are mutually connected by a bus.

In FIG. 2, the programs installed in the personal computer 42 are shown as functional blocks. In the embodiment, a reference function processing part 61 for executing a process using a reference function (to be described later) on raw data such as digitized test force data inputted via the body control device 41, a waveform analysis part 65 for performing frequency analysis, and a noise removing part 66 for executing a noise removing process for removing noise from raw data which are an input signal are provided as functional blocks.

Figure 3:
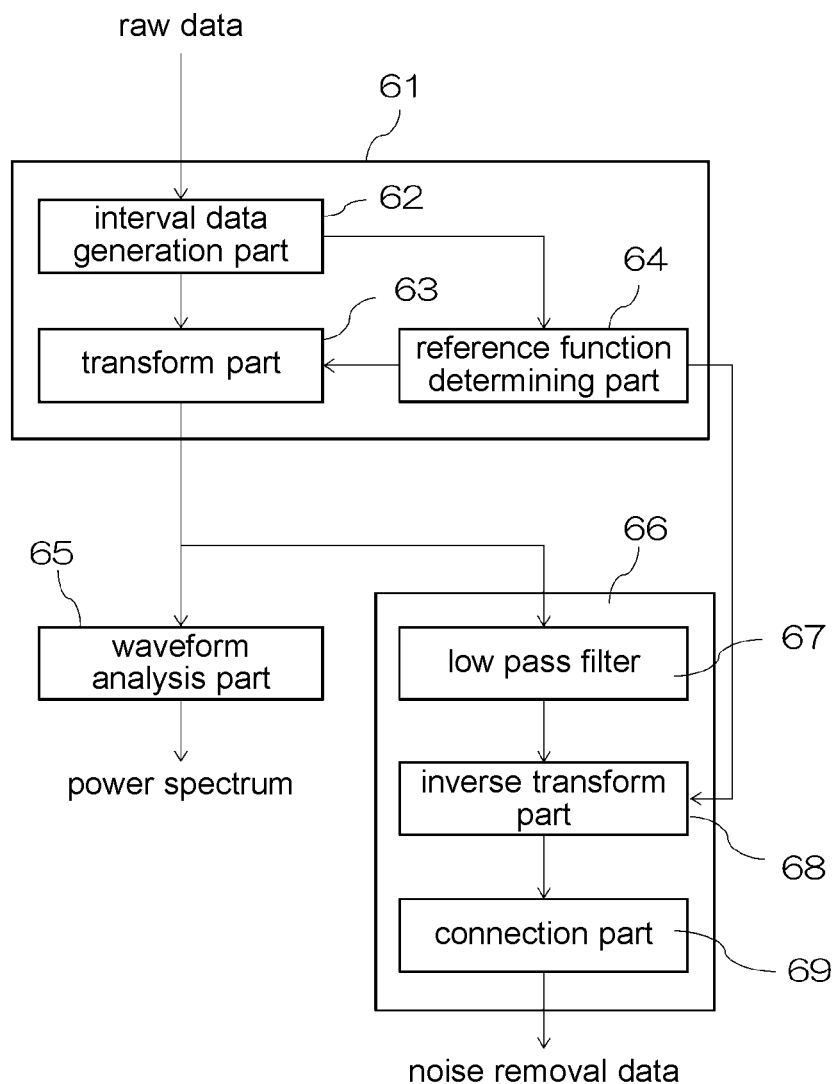
FIG. 3 is a block diagram illustrating a processing flow of each process of a signal processing method according to the disclosure.

The functional block for realizing each process of the signal processing method of the disclosure will be described in more details. FIG. 3 is a block diagram for illustrating the processing flow of each process of the signal processing method according to the disclosure. Also, an example in which the digitized test force data input from the load cell 27 to the body control device 41 is processed as an input signal will be described in FIG. 3.

The reference function processing part 61 includes an interval data generation part 62 for executing an interval data generating process of dividing the input signal from the load cell 27 into a time-domain interval data by cutting out the input signal by a predetermined time length, a reference function determining part 64 for executing a reference function determining process for determining a reference function to be used in a transform process to be described later, and a transform part 63 for executing a transform process for transforming interval data using the reference function. The noise removing part 66 includes a low pass filter 67 for executing a filtering process for removing high frequency noise from the data transformed in the transform part 63, an inverse transform part 68 for executing an inverse transform process for inversely transforming the data after the low pass filtering process using the reference function, and a connection part 69 for executing a connecting process for connecting the time data of the finite interval performed inverse transform and restoring the time data of the finite interval to the same chronological data as the input signal.

Figure 4:
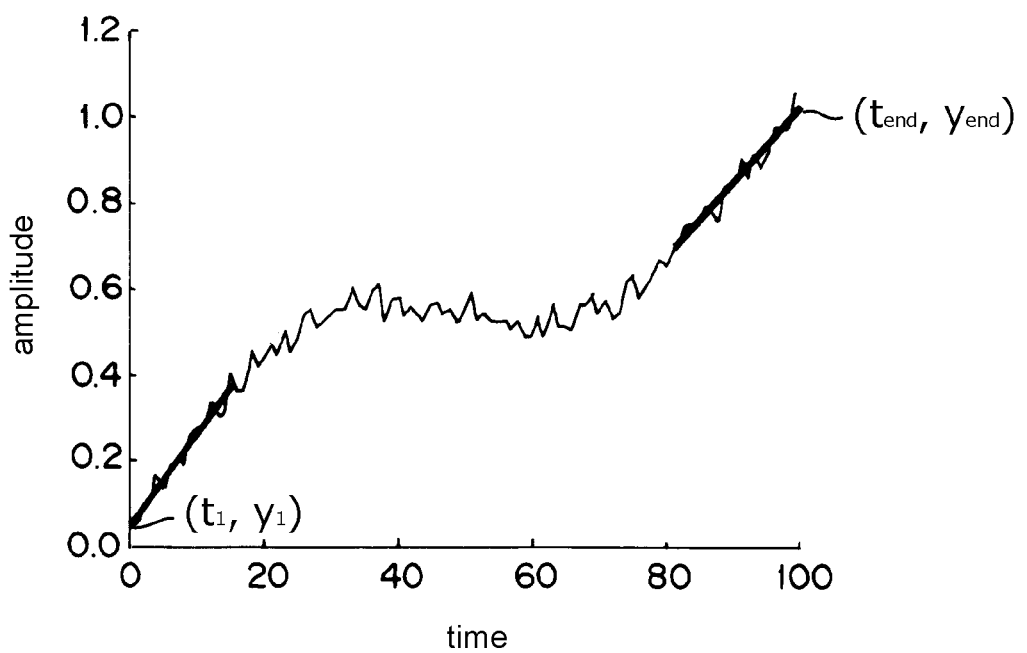
FIG. 4 is a graph illustrating calculation of a reference function.
Figure 5:
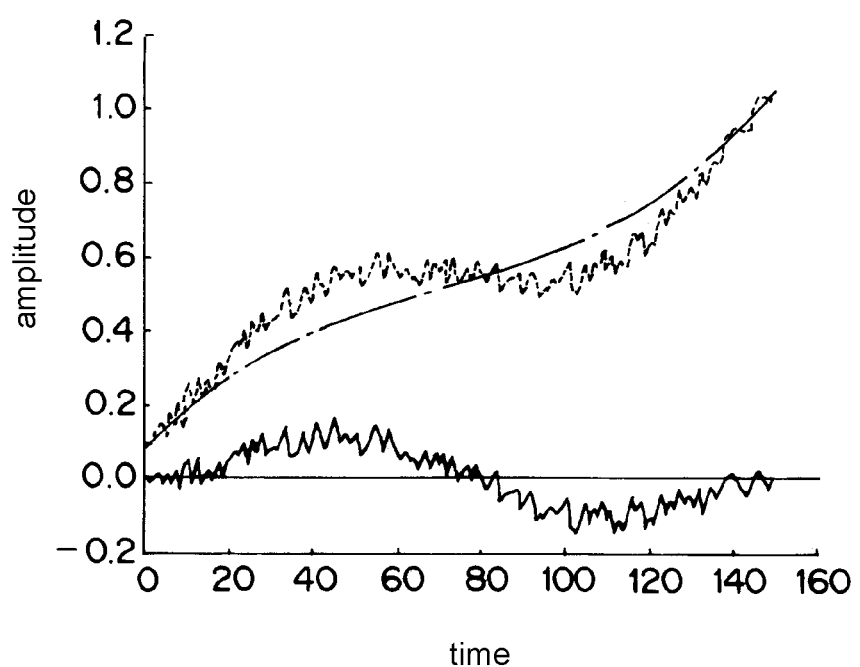
FIG. 5 is a graph illustrating data transform using the reference function.

FIG. 4 is a graph illustrating the calculation of the reference function. FIG. 5 is a graph illustrating data transform using the reference function. In the graphs of FIGS. 4 and 5, the vertical axis is amplitude and the horizontal axis is time. The number on the horizontal axis is the sampling number and the time on the horizontal axis indicates the time length for the number of sampling.

Time data of an appropriate time length, sampling point number N=100 for example, are cut out as interval data from the test force data (raw data) input from the body control device 41 to the personal computer 42. In FIG. 4, the data interval cut out from the test force data by the interval data generation part 62 is indicated by the solid line. In order to smoothly connect the starting point and end point of the interval data at the starting positions and end positions between interval data after various processing thereafter, a function that satisfies the following conditions is determined as the reference function in the embodiment. The conditions are that the gradient of the tangent connected at the starting point of the reference function curve matches the gradient of the approximately straight line near the starting position of raw data, and the gradient of the tangent connected at the end point of the reference function curve matches the gradient of the approximately straight line near the end position of the raw data. In this way, a reference function whose reference function curve matches the intersection points of the above-mentioned approximately straight lines at the starting point and the end point of both ends of the interval data can be given as the cubic curve y(x), having appropriate coefficients a, b, c, and d, shown in the following formula (1).

$$y(x)=a(x-t_1)^3+b(x-t_1)^2+c(x-t_1)+d \qquad (1)$$

As indicated by the bold lines in FIG. 4, if the approximately straight lines are drawn near the starting position and the end position of raw data, and the gradient of the approximately straight line near the starting position of the data is $k_1$ and the value at the starting position $t_1$ on the time axis of the data is $y_1$; and the gradient of the approximately straight line near the end position of the data is $k_{end}$ and the value at the end position $t_{end}$ on the time axis of the data is $y_{end}$, then the coefficients a, b, c, and d can be expressed by the following formula (2).

$$\left.\begin{aligned}a &= \frac{-2y_{end} + 2y_1 + (k_{end} + k_1)t_{end} + (-k_{end} - k_1)t_1}{t_{end}^3 - 3t_1 t_{end}^2 + 3t_1^2 t_{end} - t_1^3} \\ b &= \frac{-3y_{end} + 3y_1 + (k_{end} + 2k_1)t_{end} + (-k_{end} - 2k_1)t_1}{t_{end}^2 - 2t_1 t_{end} + t_1^2} \\ c &= k_1 \\ d &= y_1 \end{aligned}\right\} \quad (2)$$

In this way, the reference function, with the approximately straight line near the starting position matching the tangent of gradient $k_1$ of the starting point $(t_1, y_1)$ of the interval data, and with the approximately straight line near the end position matching the tangent of gradient $k_{end}$ of the end point $(t_{end}, y_{end})$ of the interval data, becomes a cubic curve $y(x)$ of the formula (1) having the coefficients a, b, c, and d of the formula (2).

In the reference function determining part 64, when a reference function, which is a cubic curve having appropriate coefficients a, b, c, and d as shown by the one-dot dashed line in FIG. 5, is obtained, transform is performed on the interval data indicated by the broken line using this reference function. The transform using the reference function in the transform part 63 is performed by subtracting the reference function from the interval data. The adjustment data after the transform have both ends (starting point and end point) that smoothly converge to zero as shown by the solid line in FIG. 5 and are continuously connected when repeated.

Various processes, such as the process of checking frequency characteristics and noise removal, are executed on the adjustment data, which have both ends of the interval data smoothly converge to zero through transform using the reference function. When checking the frequency characteristics, a time-domain signal is transformed into a frequency-domain signal by the discrete Fourier transform in the waveform analysis part 65 to obtain the power spectrum. In the conventional discrete Fourier transform which cuts out a signal by a finite time, since the interval does not exactly match the integral multiple of the period of the original input signal waveform, the repeated waveform becomes discontinuous and the spectrum spreads. Therefore, the magnitude of the peak of the spectrum decreases as compared to the true value. In the disclosure, since the discrete Fourier transform is performed on data which have both ends smoothly converge to zero, the repeated waveform becomes continuous and a correct spectrum can be obtained. That is, leakage in the discrete Fourier transform can be reduced.

In the above example, the cubic polynomial curve $y(x)$ is used as the reference function, but the degree of the reference function may be larger than the third degree. When a polynomial curve higher than the third degree is used as the reference function, appropriate coefficients are determined according to the degree. Since the reference function should be as simple as possible, it is most desirable that the reference function is a cubic polynomial function.

Figure 6:
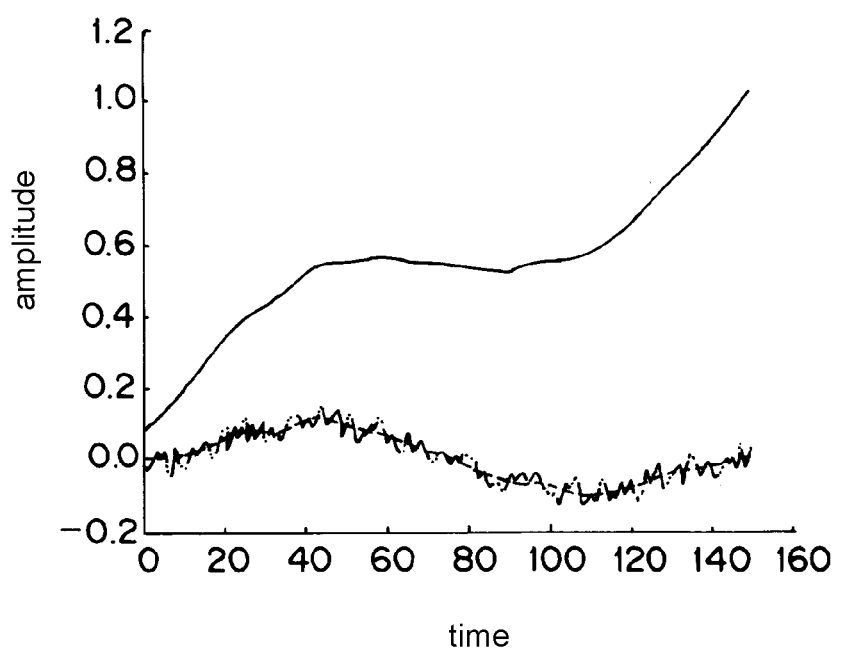
FIG. 6 is a graph showing an example of performing a low pass filtering process on the adjustment data of FIG. 5 and then performing an inverse transform by the reference function.
Figure 7A:
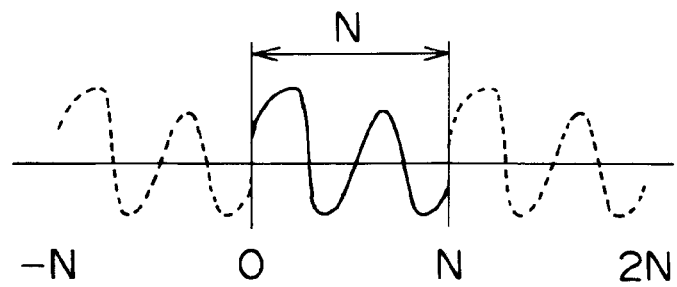
FIG. 7A and FIG. 7B are schematic diagrams illustrating signal processing to which a conventional window function is applied.
Figure 7B:
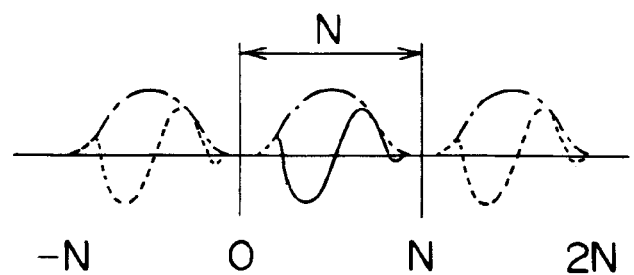
Figure 8:
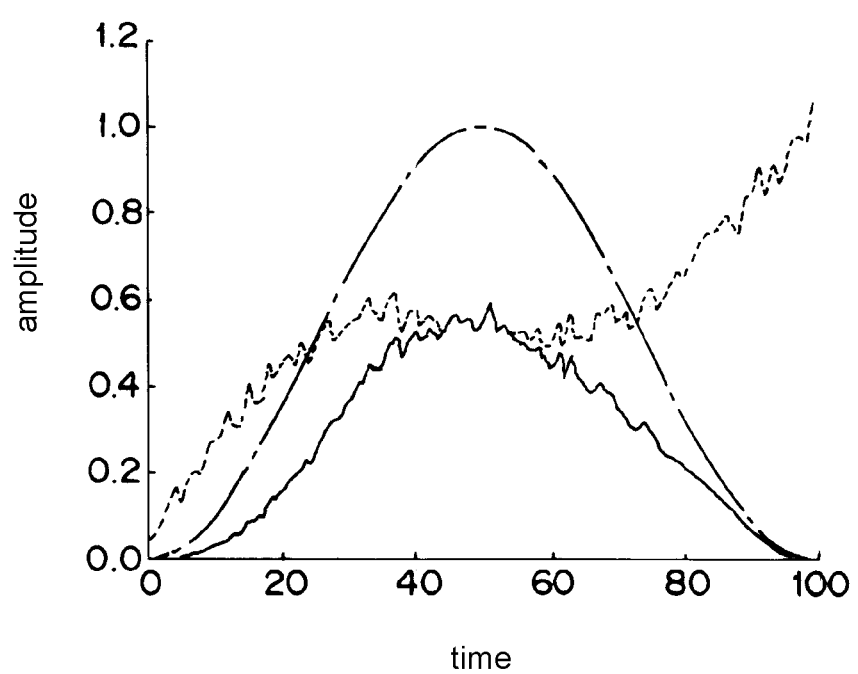
FIG. 8 is a graph showing signal processing to which a conventional window function is applied.

Next, the case of removing noise from raw data of the test force will be described. FIG. 6 is a graph for illustrating a state in which inverse transform is performed using a reference function after performing low pass filtering process on the data transformed in FIG. 5. The vertical axis of the graph is amplitude and the horizontal axis is time.

In the noise removing part 66, for each transformed data obtained by subtracting the reference function from the interval data, a high frequency removing process of the low pass filter 67 is executed. The cutoff frequency of the low pass filter 67 is determined based on the power spectrum obtained by the discrete Fourier transform in the waveform analysis part 65. As shown in FIG. 6, when the transformed data indicated by the two-dot dashed line is subjected to the low pass filter 67, the waveform shown by the broken line is obtained. When inverse transform that adds the reference function is performed on the data after the filtering process, the waveform shown by the solid line in FIG. 6 is obtained.

For the interval data before transform of the reference function as shown by the broken line in FIG. 5 and the data processed by the inverse transform of the reference function after the filtering process as shown by the solid line in FIG. 6, the values of the starting position and the end position of the interval are held. In this way, when the data are returned to the original chronological data by inverse transform using the reference function, it is not possible for the data to be enlarged at higher magnification and for the noise to be amplified closer to both ends of the data due to inverse transform, as for the case of using the conventional Hann window. That is, it is possible to reversibly eliminate the influence of the reference function from the data.

The tendency of the input signal waveform is retained even after transform and inverse transform using the reference function and each interval data after the processing can be smoothly connected at the starting point and the end point in the connection part 69. Thus, when restoring to the original chronological data, the connection portions are not discontinuous. In this way, by using the reference function, the starting point and the end point of the data can be smoothly connected in the same manner as the window function, the accuracy of processing can be improved, and there is no decrease or missing of data at both ends of the interval data, like for the window function, nor is there influence of noise amplification due to inverse transform left in the data.

Thus, the reference function of the disclosure can be used for reversible preprocessing of signals that cannot be done with the conventional window function. Transform by the reference function, in place of the window function, of the disclosure is used for preprocessing of the discrete Fourier transform and filtering process on raw data such as test force data and displacement data, thereby improving the accuracy of data processing. The disclosure is not limited to discrete Fourier transform. Even for discrete cosine transform and discrete wavelet transform which cut out data using the conventional window function, transform using the reference function of the disclosure instead of the window function can be used for preprocessing.

Also, in the embodiment, the program for realizing the signal processing method of the disclosure is installed in the memory 53 of the personal computer 42 and executed by the personal computer 42, but a processing circuit for executing the program may be provided in the body control device 41.

The embodiment described above illustrates an example in which the signal detected by the load cell, which is the physical quantity detector of the material testing machine executing the high speed tensile test, is set as the input signal. However, material testing machines using this signal processing method are not limited to the above. For example, as described in Patent Document 1, the signal processing method of the disclosure can also be applied to a fatigue testing machine which drives a load actuator by a drive signal generated by multiplying an actual vibration waveform by an inverse transfer function. In other words, since the frequency response of the discrete Fourier transform shows the characteristics of the band pass filter of a certain bandwidth, the discrete Fourier transform is performed on the iteration processing for correcting the response to the target value for each frequency upon generating the drive signal. Since leakage in the discrete Fourier transform can be reduced using the reference function of the signal processing method, the signal processing method of the disclosure can also be applied to the fatigue testing machine which executes iteration processing.

What is claimed is:

1. A signal processing method, comprising:
   separating two end parts of a test piece by a pair of grippers;
   detecting physical quantity of the test piece by a physical quantity detector;
   an interval data generating process of dividing an input signal into interval data of time-domain by cutting out the input signal by a predetermined time length, wherein the input signal is a detecting result output by the physical quantity detector;
   a reference function determining process of determining a function as a reference function, wherein the function matches a gradient of a tangent with a tangent point falling on a starting point of the interval data with a gradient of an approximately straight line near a starting position of the interval data and matches a gradient of a tangent with a tangent point falling on an end point of the interval data with a gradient of an approximately straight line near an end position of the interval data; and
   a transform process of transforming the interval data into adjustment data adjusted using the reference function determined in the reference function determining process so that both ends of a waveform of the interval data smoothly converge to zero.

2. The signal processing method according to claim 1, wherein the reference function is a polynomial function of degree 3 or higher.

3. The signal processing method according to claim 1, wherein the reference function determining process sets the starting position of the interval data on a time axis to $t_1$ with a value $y_1$, sets the gradient of the approximately straight line near the starting position which is a tangent at a starting point $(t_1, y_1)$ to $k_1$, sets the end position of the interval data on the time axis to $t_{end}$ with a value $y_{end}$, sets the gradient of the approximately straight line near the end position which is a tangent at an end point $(t_{end}, y_{end})$ to $k_{end}$, and determines a cubic curve $y(x)$ of formula (1) below having coefficients a, b, c, and d expressed by formula (2) below as the reference function, $$y(x) = a(x-t_1)^3 + b(x-t_1)^2 + c(x-t_1) + d \quad (1)$$

$$\left.\begin{array}{l} a = \dfrac{-2y_{end} + 2y_1 + (k_{end} + k_1)t_{end} + (-k_{end} - k_1)t_1}{t_{end}^3 - 3t_1 t_{end}^2 + 3t_1^2 t_{end} - t_1^3} \\ b = \dfrac{-3y_{end} + 3y_1 + (k_{end} + 2k_1)t_{end} + (-k_{end} - 2k_1)t_1}{t_{end}^2 - 2t_1 t_{end} + t_1^2} \\ c = k_1 \\ d = y_1 \end{array}\right\} \quad (2)$$

4. The signal processing method according to claim 2, wherein the reference function determining process sets the starting position of the interval data on a time axis to $t_1$ with a value $y_1$, sets the gradient of the approximately straight line near the starting position which is a tangent at a starting point $(t_1, y_1)$ to $k_1$, sets the end position of the interval data on the time axis to $t_{end}$ with a value $y_{end}$, sets the gradient of the approximately straight line near the end position which is a tangent at an end point $(t_{end}, y_{end})$ to $k_{end}$, and determines a cubic curve $y(x)$ of formula (1) below having coefficients a, b, c, and d expressed by formula (2) below as the reference function, $$y(x) = a(x-t_1)^3 + b(x-t_1)^2 + c(x-t_1) + d \quad (1)$$

$$\left.\begin{array}{l} a = \dfrac{-2y_{end} + 2y_1 + (k_{end} + k_1)t_{end} + (-k_{end} - k_1)t_1}{t_{end}^3 - 3t_1 t_{end}^2 + 3t_1^2 t_{end} - t_1^3} \\ b = \dfrac{-3y_{end} + 3y_1 + (k_{end} + 2k_1)t_{end} + (-k_{end} - 2k_1)t_1}{t_{end}^2 - 2t_1 t_{end} + t_1^2} \\ c = k_1 \\ d = y_1 \end{array}\right\} \quad (2)$$

5. The signal processing method according to claim 1, wherein the transform process transforms the interval data into the adjustment data by subtracting the reference function from the interval data.

6. The signal processing method according to claim 2, wherein the transform process transforms the interval data into the adjustment data by subtracting the reference function from the interval data.

7. The signal processing method according to claim 3, wherein the transform process transforms the interval data into the adjustment data by subtracting the reference function from the interval data.

8. The signal processing method according to claim 4, wherein the transform process transforms the interval data into the adjustment data by subtracting the reference function from the interval data.

9. The signal processing method according to claim 1, comprising:
   a noise removing process of removing noise from the adjustment data, wherein
   the noise removing process comprises:
   a filtering process performed by a low pass filter;
   an inverse transform process of performing inverse transform on data, from which high frequency noise has been removed in the filtering process, using the reference function; and
   a connecting process of connecting the data performed inverse transform in the inverse transform process and restoring the data to chronological data same as the original input signal.

10. The signal processing method according to claim 2, comprising:
    a noise removing process of removing noise from the adjustment data, wherein
    the noise removing process comprises:
    a filtering process performed by a low pass filter;
    an inverse transform process of performing inverse transform on data, from which high frequency noise has been removed in the filtering process, using the reference function; and
    a connecting process of connecting the data performed inverse transform in the inverse transform process and restoring the data to chronological data same as the original input signal.

11. The signal processing method according to claim 3, comprising:
    a noise removing process of removing noise from the adjustment data, wherein
    the noise removing process comprises:
    a filtering process performed by a low pass filter;

an inverse transform process of performing inverse transform on data, from which high frequency noise has been removed in the filtering process, using the reference function; and a connecting process of connecting the data performed inverse transform in the inverse transform process and restoring the data to chronological data same as the original input signal.

12. The signal processing method according to claim 4, comprising:

a noise removing process of removing noise from the adjustment data, wherein the noise removing process comprises:

a filtering process performed by a low pass filter;

an inverse transform process of performing inverse transform on data, from which high frequency noise has been removed in the filtering process, using the reference function; and a connecting process of connecting the data performed inverse transform in the inverse transform process and restoring the data to chronological data same as the original input signal.

13. The signal processing method according to claim 5, comprising:

a noise removing process of removing noise from the adjustment data, wherein the noise removing process comprises:

a filtering process performed by a low pass filter;

an inverse transform process of performing inverse transform on data, from which high frequency noise has been removed in the filtering process, using the reference function; and a connecting process of connecting the data performed inverse transform in the inverse transform process and restoring the data to chronological data same as the original input signal.

14. The signal processing method according to claim 6, comprising:

a noise removing process of removing noise from the adjustment data, wherein the noise removing process comprises:

a filtering process performed by a low pass filter;

an inverse transform process of performing inverse transform on data, from which high frequency noise has been removed in the filtering process, using the reference function; and a connecting process of connecting the data performed inverse transform in the inverse transform process and restoring the data to chronological data same as the original input signal.

15. The signal processing method according to claim 7, comprising:

a noise removing process of removing noise from the adjustment data, wherein the noise removing process comprises:

a filtering process performed by a low pass filter;

an inverse transform process of performing inverse transform on data, from which high frequency noise has been removed in the filtering process, using the reference function; and a connecting process of connecting the data performed inverse transform in the inverse transform process and restoring the data to chronological data same as the original input signal.

16. The signal processing method according to claim 8, comprising:

a noise removing process of removing noise from the adjustment data, wherein the noise removing process comprises:

a filtering process performed by a low pass filter;

an inverse transform process of performing inverse transform on data, from which high frequency noise has been removed in the filtering process, using the reference function; and a connecting process of connecting the data performed inverse transform n the inverse transform process and restoring the data to chronological data same as the original input signal.

17. A material testing machine comprising a control device for processing a time-domain signal input from the physical quantity detector by the signal processing method according to claim 1.

18. A material testing machine comprising a control device for processing a time-domain signal input from the physical quantity detector by the signal processing method according to claim 2.

19. A material testing machine comprising a control device for processing a time-domain signal input from the physical quantity detector by the signal processing method according to claim 3.

20. The material testing machine according to claim 17, wherein the physical quantity detector is a force detector that detects a test force given to a test piece in a material test or a displacement meter that detects displacement occurred to the test piece in the material test.

* * * * *